United States Patent
Ferraiuolo, Jr.

(10) Patent No.: US 10,236,093 B2
(45) Date of Patent: Mar. 19, 2019

(54) METER LUG ISOLATOR

(71) Applicant: Anthony S. Ferraiuolo, Jr., Sparta, NY (US)

(72) Inventor: Anthony S. Ferraiuolo, Jr., Sparta, NY (US)

(*) Notice: Subject to any disclaimer, the term of this patent is extended or adjusted under 35 U.S.C. 154(b) by 0 days.

(21) Appl. No.: 14/706,094

(22) Filed: May 7, 2015

(65) Prior Publication Data
US 2015/0325342 A1 Nov. 12, 2015

Related U.S. Application Data
(60) Provisional application No. 61/990,935, filed on May 9, 2014.

(51) Int. Cl.
| | | |
|---|---|---|
| *H01B 3/28* | (2006.01) | |
| *H01B 17/56* | (2006.01) | |
| *G01R 11/04* | (2006.01) | |
| *G01R 11/24* | (2006.01) | |

(52) U.S. Cl.
CPC ............ *H01B 3/28* (2013.01); *G01R 11/04* (2013.01); *G01R 11/24* (2013.01); *H01B 17/56* (2013.01)

(58) Field of Classification Search
CPC .................................. H02B 1/14; H02B 1/06
USPC ................ 174/6, 539, 137 R; 361/641, 659; 439/893
See application file for complete search history.

(56) References Cited

U.S. PATENT DOCUMENTS

| | | | | |
|---|---|---|---|---|
| 1,486,415 A | * | 3/1924 | Casper ................... | G01R 11/04 174/50 |
| 2,862,997 A | * | 12/1958 | Veitch ..................... | H01R 4/70 174/138 F |
| 2,882,454 A | * | 4/1959 | Davis, III .............. | G01R 11/04 174/539 |
| 2,916,591 A | * | 12/1959 | Benn ....................... | H02B 1/50 174/38 |
| 2,953,625 A | * | 9/1960 | Hasselhorn ........... | H02G 15/076 174/152 G |
| 2,991,398 A | * | 7/1961 | Strong ................... | G01D 11/24 174/520 |
| 3,151,924 A | * | 10/1964 | Sloop ..................... | H01R 24/76 439/167 |
| 3,361,938 A | * | 1/1968 | Watson ................... | H02B 1/50 174/38 |
| 3,450,951 A | * | 6/1969 | Boyle ..................... | H02B 1/50 174/38 |
| 3,609,647 A | * | 9/1971 | Castellano .............. | H02G 3/16 174/53 |
| 3,753,047 A | * | 8/1973 | Shallbetter ............. | H02B 1/50 174/60 |
| 3,764,858 A | * | 10/1973 | Burkhart, Jr. ......... | G01R 11/02 324/156 |
| 4,162,516 A | * | 7/1979 | Becker ................... | H02B 1/40 324/149 |

(Continued)

*Primary Examiner* — Dhiru R Patel
(74) *Attorney, Agent, or Firm* — Budzyn IP Law, LLC

(57) ABSTRACT

The present disclosure provides for an electrically insulative cover that can be used to cover a variety of electrical components, namely hot lugs. The cover has a top surface and at least one side surface. The cover provides a shield between the lug and the individual performing work on the lug containing device. This reduces the need to disconnect and reconnect the flow of electricity which can be costly for customers. Additionally, it allows electrical work to be done more autonomously efficiently and safely.

6 Claims, 4 Drawing Sheets

(56) References Cited

U.S. PATENT DOCUMENTS

| | | | | | |
|---|---|---|---|---|---|
| 4,336,417 | A | * | 6/1982 | Hickling | H01H 9/02 174/138 F |
| 4,615,113 | A | * | 10/1986 | Fennel | G01R 11/04 174/5 R |
| 4,774,390 | A | * | 9/1988 | Lehman | H01H 9/0264 174/138 F |
| 4,809,132 | A | * | 2/1989 | Palmieri | H01H 71/08 335/202 |
| 5,114,792 | A | * | 5/1992 | McWilliams | B32B 27/08 428/412 |
| 5,304,761 | A | * | 4/1994 | Rosen | H01H 9/0264 200/304 |
| 5,488,337 | A | * | 1/1996 | Hubbard | H01H 9/0264 335/202 |
| 5,834,932 | A | * | 11/1998 | May | G01R 11/04 324/107 |
| 6,906,260 | B2 | * | 6/2005 | Grendahl | H02G 3/12 174/58 |
| 7,199,572 | B1 | * | 4/2007 | May | G01R 11/04 324/156 |
| 7,405,923 | B2 | * | 7/2008 | Kelly | H02B 1/42 174/72 A |
| 8,697,989 | B2 | * | 4/2014 | Holovnia | G01R 11/04 174/50 |

* cited by examiner

METER LUG ISOLATOR

CLAIM OF PRIORITY

This application is a utility patent application and is claiming priority filing on May 9, 2014 U.S. PTO Application No. 61/990,935.

FIELD OF THE EMBODIMENTS

The Field of this invention and associated embodiments relates to insulated covers, namely covers used to shield one from electricity. In particular, the present field relates to an electrically insulating cover for use in meter pans that assist in supplying electricity to structures including homes and businesses.

BACKGROUND OF THE EMBODIMENTS

An electric meter is a device that measures the consumption of electricity used by a residence, business, or other location or electrically powered device. Tampering with such meters, especially on homes and businesses, can cause the meter to under-report consumed electricity thereby enabling an individual to use electricity without paying for it. To combat this potential theft, meters will have a tamper proof tag and methods of opening the meter. Thus, a lineman, meter reader or electrician is generally required in order to perform any service or maintenance on the meter or customer owned meter socket equipment.

In order to perform work on the voltage innards of the electric meter, the lineman, meter reader, or electrician often must cut the taps leading into the meter or have the utility company perform a disconnect/reconnect of the flow of electricity before and after their work on the meter or meter socket if they are needed. This disconnect/reconnect is sometimes charged to the consumer as a fee by the utility company. If such a service is not performed, there is a risk of great bodily harm or death befalling the lineman, meter reader, or electrician. Thus, there is a need for a device that absolves the need for outside support (i.e. a utility company) and enables a licensed worker to perform their duties without having to cut the taps leading into an electric meter socket.

REVIEW OF RELATED TECHNOLOGY

U.S. Pat. No. 3,644,878 describes a connector having a terminal with an outer insulating cover and an inner conducting portion and a conductor having an outer insulating cover and a conductor lug detachably connected to the inner conducting portion of the terminal. A resilient waterproof sheath extends between and is in sealing engagement with the insulating covers of both the terminal and the conductor. Each sheath end includes internal, annular ribs having a smaller diameter that the diameter of the engaged insulating cover material, thus deforming the insulating material into indentations. The resulting pressure from the sheath combined with the heat environment within the sheath provides a bonded seal between the sheath and the insulation material. The terminal outer insulating cover is formed into a retaining boss which is engageable by one of the internal, annular ribs at the terminal end of the sheath.

Various devices are known in the art. However, their stricture and means of operation are substantially different from the present disclosure. The other inventions fail to solve all the problems taught by the present disclosure.

The present invention provides for an insulative cover that can be used in an electric meter pan amongst other settings. The cover provides a safe and efficient tool for assisting a lineman, meter reader, or electrician in performing their duties, when working on load side of socket. At last one embodiment of this invention is presented in the drawings below and will be described in more detail herein.

SUMMARY OF THE EMBODIMENTS

The present invention describes an electrically insulative cover having a top panel; and at least one side panel having a length, wherein the at least one side panel is coupled to the top panel, wherein the top panel and the at least one side panel comprises a polymeric material. Preferably there are four side panels, although the number of side panels may vary from about 1 to about 10 side panels. At least one of the side panels may have a length that is less than that of the other side panels. The electrically insulative cover is preferably formed from an electrically insulative rubber. In some instances, the cover has an adhesive disposed on the at least one side panel.

In another aspect of the present invention there is a system for shielding electricity having an electrically insulative cover comprising, a top panel, four side panels, each having an outer surface, an inner surface, and a bottom surface, wherein at least one of the four side panels has a length that is less than that of the other side panels, an adhesive disposed on the bottom side of the four panels, wherein the adhesive is removable; wherein the cover comprises a rubber based composition; and a meter pan having at least one lug, wherein the electrically insulative cover is placed over the at least one lug.

The electrically insulative cover may be positioned over the lug with or without electricity being suppled thereto. In order to fit over the lug, there may be at least one side panel having an angled bottom surface.

This accommodates any structure that may otherwise impede complete coverage of the lug. Preferably, the cover is formed from a silicone based rubber although most any rubber should suffice, and a number of the electrically insulative materials maybe used.

Generally, the electrically insulative cover is shaped and designed to fit over one or more lugs in an electric meter socket. The shape of the lug may result in some variation of the shape of the electrically insulative cover. The cover is placed over a hot lug to protect the technician working on the apparatus. The cover may further have a removable adhesive to help ensure the cover stays in place while the technician is working. This prevents the cover from shifting out of place and placing the technician at risk for serious injury. The cover can comprise any material that is electrically insulative and other materials not known for their insulative properties but for other qualities (i.e. flexibility, strength, etc.) that may be combined with the electrically insulative materials.

In general, the present invention succeed in conferring the following, and others not mentioned, benefits and objectives.

It is an object of the present invention to provide an electrically insulative cover that provides protection from electricity to individuals working with electrical equipment.

It is an object of the present invention to provide an electrically insulative cover that is used in an electric meter.

It is an object of the present invention to provide an electrically insulative cover that is inexpensive.

It is an object of the present invention to provide an electrically insulative cover that can be adhered to a second object.

It is an object of the present invention to provide an electrically insulative cover that is lightweight and durable.

It is another object of the present invention to provide an electrically insulative cover that shields multiple electrical components at once.

It is another object of the present invention to provide an electrically insulative cover that prevents disconnecting/reconnecting to wires of electricity in order to service a home, business, or the like.

DESCRIPTION OF THE PREFERRED EMBODIMENTS

Figure 1:
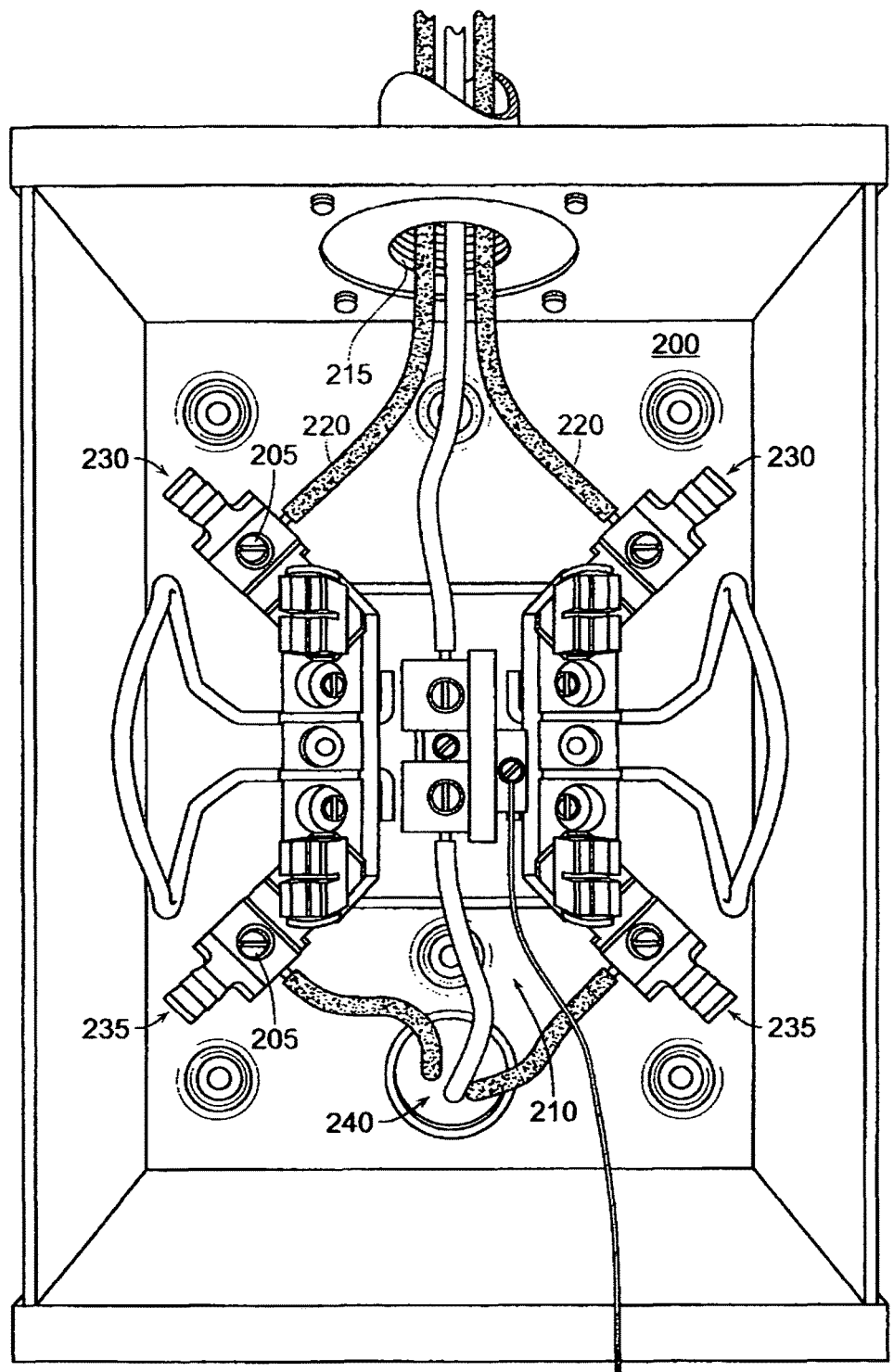
FIG. 1 is a front view of a meter pan with the cover removed showing the internal structure without the electrically insulative covers in place.

The preferred embodiments of the present invention will now be described with reference to the drawings. Identical elements in the various figures are identified with the same reference numerals. Reference will now be made in detail to each embodiment of the present invention.

Such embodiments are provided by way of explanation of the present invention, which is not intended to be limited thereto. In fact, those of ordinary skill in the art may appreciate upon reading the present specification and viewing the present drawings that various modifications and variations can be made thereto.

Referring now to FIG. 1, there is a meter pan 200 with the cover (not shown) having been removed. The meter pan 200 has electrical apparatus that directs the flow of electricity from a transformer to a structure such as a home or business. The line lugs 230 bring in the flow of electricity from an outside source, typically a transformer. The load lugs 235 bring the flow of electricity to the customer. A neutral 240 is used as a ground and does not typically carry the flow of electricity. The wiring 220 stems from the outside source of electricity to the line lugs 230 and from the load lugs 235 to the structure. The wiring 220 enters and exits the meter pan 200 through apertures 215. Screw plates 205 provide a secure connection between the line lugs 230 and the load lugs 235. These structures are connected to the back 210 or the meter pan 200 via an insulated block.

Figure 2:
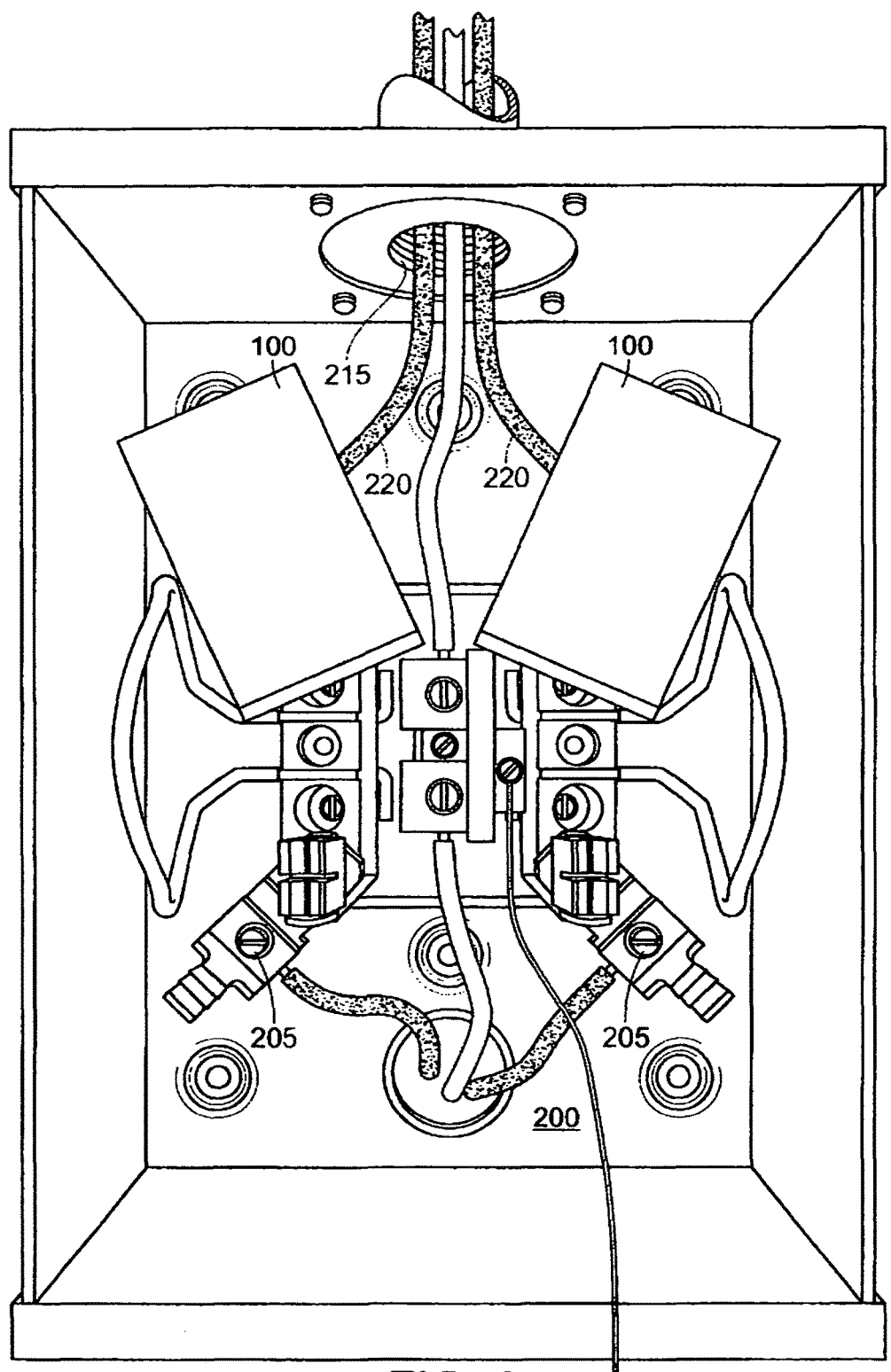
FIG. 2 is a front view of a meter pan with the cover removed showing the internal structure with one embodiment of the electrically insulative covers in place.

In FIG. 2 there is one embodiment of the present invention. The electrically insulative cover 100 is used in tandem to cover the line lugs 230 (see FIG. 1).

Figure 3:
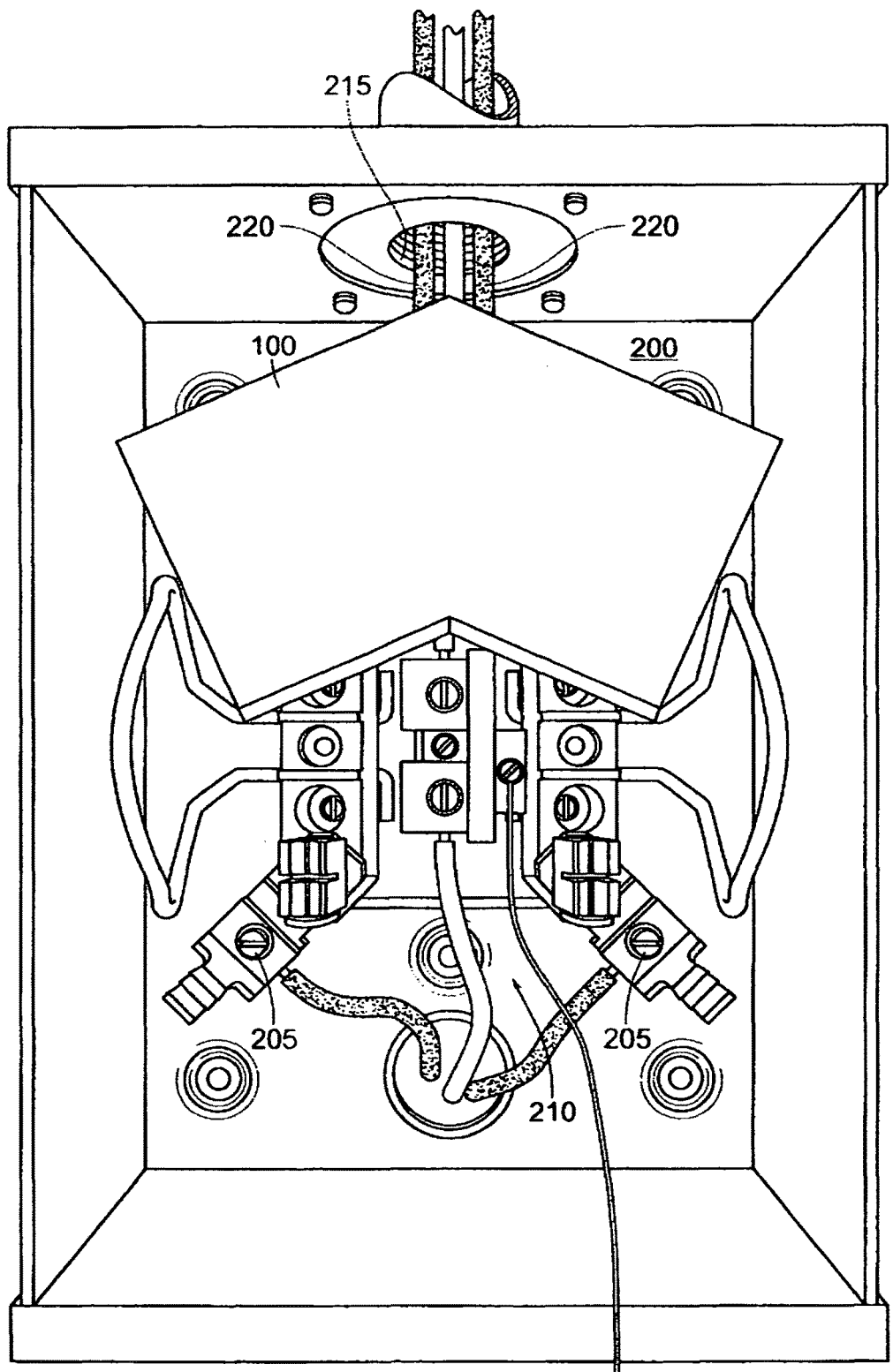
FIG. 3 is a front view of a meter pan with the cover removed showing the internal structure with an alternate embodiment of the electrically insulative covers in place.

In FIG. 3 there is another embodiment of the present invention. The electrically insulative cover 100 here covers both line lugs 230 at the same time. The set-up is the same as shown in FIG. 2 with the difference being in the area of coverage of the electrically insulative cover 100 with cutout for lines 220 and ground wire.

Figure 4:
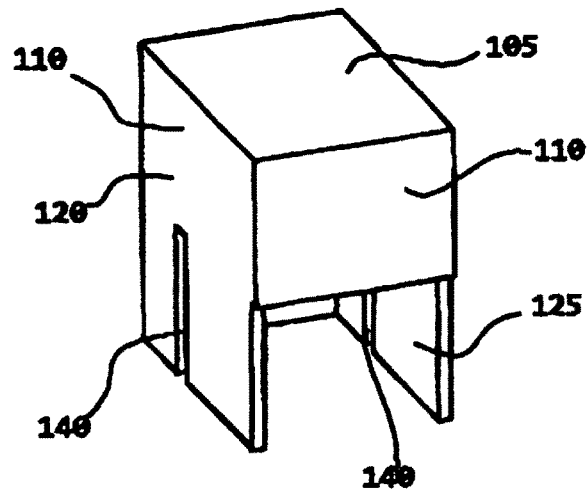
FIG. 4 is a first side view of one embodiment of the electrically insulative covers showing at least one shape of the cover.

FIG. 4 shows the electrically insulative cover 100 from side view. Here, the features of the electrically insulative cover 100 are readily visible. The cover 100 has a top panel 105 and four (4) side panels 110. Two of the side panels 110 of insulative cover 100 may have a cutout 140 that will allow for a tight fit to accommodate lines 220.

Figure 5:
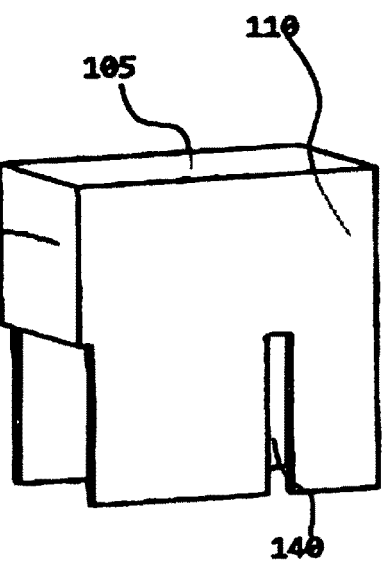
FIG. 5 is a second side view of one embodiment of the electrically insulative covers.

Referring now to FIG. 5, there is a second side view of the electrically insulative cover 100. The side panels 110 are coupled to the top panel 105. The top panel 105 and the side panels 110 may be integrated and formed of a single piece. The cutout 140 is visible, placement of it may vary.

Figure 6:
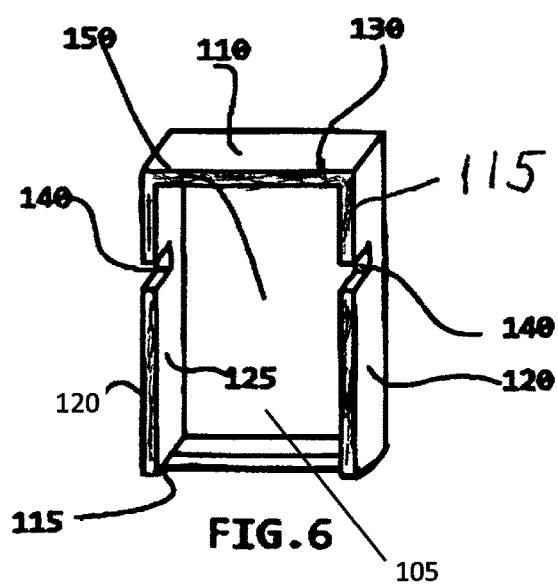
FIG. 6 is a bottom view of one embodiment of the electrically insulative covers.

In FIG. 6 the electrically insulative cover 100 is shown from a bottom view. The configuration of the side panels 110 is shown along with adhesive 115 disposed on bottom surface 130. Each of the side panels 110 are coupled to another side panel 110 and the top panel 105. Each of the side panels 110 has an outer surface 120, an inner surface 125, and a bottom surface 130. This leaves an opening 150 on the bottom side of the cover 100 which receives the line lug 230 (see FIG. 1). At least one of the side panels 110 has a length that is less than that of the other side panels 110.

Generally, the electrically insulative cover 100 shown in FIGS. 3-6 has a top panel 105 and at least one side panel 110. The side panels 110 may be coupled to the top panel 105 and the other, if present, side panels 110 by adhesives or other proper securement mechanisms. If the cover 100 is pieced together in this fashion, the securement mechanism, whether mechanical or chemical in nature, must be able to withstand the high voltage environment of the meter pan 200. For this reason it is preferable that the cover 100 is formed from a continuous piece of material. The material chosen must be resistant to the aforementioned high voltage environments in the meter pan 200 or elsewhere. Preferably this material is a rubber which may include, but is not limited to, natural rubber, styrene-butadiene rubber (SBR), Isoprene rubber, Butadiene rubber, and (poly)chloroprene rubber and the like or any combination thereof. Preferably the rubber choice is a silicone based rubber.

The overall shape and appearance of the electrically insulative cover 100 may vary as with its intended purpose. As shown in FIGS. 2-3, the electrically insulative cover 100 preferably covers one (1) or two (2) line lugs 230 at once as one is to be most concerned about the line lugs 230. Thus, the shape may vary depending on the amount of line lugs 230 covered or the amount of extraneous electrical apparatus that is covered as well.

Although this invention has been described with a certain degree of particularity, it is to be understood that the present disclosure has been made only by way of illustration and that numerous changes in the details of construction and arrangement of parts may be resorted to without departing from the scope of the invention.

What is claimed is:

1. A system for shielding electricity comprising:
an electrically insulative cover comprising:
  a top panel,
  a plurality of side panels, each of said plurality of side panels having an outer surface, an inner surface, and a bottom surface extending between the outer and inner surfaces, the plurality of side panels being coupled to, and protruding from, the top panel with the bottom surfaces being exposed, the plurality of side panels bounding the top panel so as to continuously encircle the top panel, wherein a first side panel of the plurality of side panels has a length, as measured in a direction away from the top panel, that is less than the remaining plurality of side panels, wherein a second side panel of the plurality of side panels includes a cutout commencing at the bottom surface of the second side panel;

wherein the cover further comprises a rubber based composition; and an existing meter pan having two line lugs located on the supply-side of the meter pan wired to receive a flow of electricity from an outside source, two load lugs wired to convey a flow of electricity to a structure, and an electric meter socket located between the line lugs and the load lugs, wherein the electrically insulative cover is sized to fit over and shield a first of the line lugs without shielding the load lugs of the existing meter pan.

2. The system of claim 1, wherein the electrically insulative cover shields the first line lug with or without electricity being supplied thereto.

3. The system of claim 1, wherein the electrically insulative cover includes silicone rubber.

4. The system of claim 1, further comprising two electrically insulative covers, each of said two electrically insulative covers sized to shield one of the line lugs of the meter pan.

5. The system of claim 1, further comprising an adhesive disposed on at least a portion of the bottom surfaces.

6. The system of claim 5, wherein the adhesive is removable.

* * * * *

UNITED STATES PATENT AND TRADEMARK OFFICE
CERTIFICATE OF CORRECTION

PATENT NO. : 10,236,093 B2
APPLICATION NO. : 14/706094
DATED : March 19, 2019
INVENTOR(S) : Anthony S. Ferraiuolo, Jr.

Page 1 of 1

It is certified that error appears in the above-identified patent and that said Letters Patent is hereby corrected as shown below:

On the Title Page

Item (71), "Applicant", applicant's city and state "Sparta, NY" should read as --Sparta, NJ--.

Item (72), "Inventor", inventor's city and state "Sparta, NY" should read as --Sparta, NJ--.

Signed and Sealed this
Twenty-eighth Day of May, 2019

Andrei Iancu
*Director of the United States Patent and Trademark Office*